(12) United States Patent
Romann et al.

(10) Patent No.: US 10,087,541 B2
(45) Date of Patent: Oct. 2, 2018

(54) METHOD OF FORMING A DIELECTRIC THROUGH ELECTRODEPOSITION ON AN ELECTRODE FOR A CAPACITOR

(71) Applicant: University of Tartu, Tartu (EE)

(72) Inventors: Tavo Romann, Tartu (EE); Enn Lust, Tartu (EE); Ove Oll, Tartu (EE)

(73) Assignee: University of Tartu, Tartu (EE)

( * ) Notice: Subject to any disclaimer, the term of this patent is extended or adjusted under 35 U.S.C. 154(b) by 17 days.

(21) Appl. No.: 15/515,002

(22) PCT Filed: Sep. 29, 2015

(86) PCT No.: PCT/EP2015/072399
§ 371 (c)(1),
(2) Date: Mar. 28, 2017

(87) PCT Pub. No.: WO2016/050761
PCT Pub. Date: Apr. 7, 2016

(65) Prior Publication Data
US 2017/0241036 A1    Aug. 24, 2017

(30) Foreign Application Priority Data

Sep. 29, 2014 (GB) .................................. 1417157.3

(51) Int. Cl.
*H01G 9/00* (2006.01)
*C25D 9/02* (2006.01)
(Continued)

(52) U.S. Cl.
CPC .............. *C25D 9/02* (2013.01); *C08G 73/02* (2013.01); *H01G 9/0029* (2013.01);
(Continued)

(58) Field of Classification Search
CPC ........... C25D 9/02; H01G 9/0029; H01G 9/02
(Continued)

(56) References Cited

U.S. PATENT DOCUMENTS 1,329,348 A * 1/1920 Copeland .............. F04B 27/005
                                                   123/193.1
4,640,753 A    2/1987 Banks et al.
(Continued)

FOREIGN PATENT DOCUMENTS

EP    0106352    4/1984
EP    0178816    4/1986
(Continued)

OTHER PUBLICATIONS

Ho et al. (2010) "Historical introduction to capacitor technology" IEEE Electrical Insulation Magazine, 26:20-25.
(Continued)

*Primary Examiner* — David S Blum
(74) *Attorney, Agent, or Firm* — Edward J. Baba; Bozicevic, Field & Francis LLP (57) ABSTRACT

The present invention relates to a method for forming a capacitor having carbon or metal electrodes and an electrolyte which is also a source of electropolymerisable anions. Applying a sufficiently positive voltage, a thin dielectric layer forms at the positive electrode, enabling the use of cell voltages higher than 3.5 V. The construction and characteristics of capacitors with 5, 6.3, and 10 V of cell voltages, having reduced graphene oxide electrodes and an ionic liquid electrolyte, are shown. Further, a method of forming a capacitor, including the steps of: (a) providing a first electrode; (b) providing a first electrolyte including an anionic compound, wherein said compound includes at least one cyano group or at least one nitrile group; (c) electropolymerising said anionic compound in order to form a dielectric layer on at least part of the first electrode; (d) forming a capacitor including the electrode of step (c), a second electrode and a second electrolyte, which is the same or different to the first electrolyte, is claimed. In a further aspect of the invention, there is provided an electronic device (Continued)

including a capacitor, a transistor or an electrode produced by means of a method as defined above. It is believed that a number of dielectric compounds produced by the method as defined above are new compounds not previously isolated. Accordingly, polytetracyanoborate, polycyani, or polytricyanomethanide.

18 Claims, 3 Drawing Sheets

(51) Int. Cl.
| | |
|---|---|
| H01G 9/028 | (2006.01) |
| H01G 9/15 | (2006.01) |
| H01L 21/28 | (2006.01) |
| H01G 9/042 | (2006.01) |
| H01G 9/048 | (2006.01) |
| H01G 11/86 | (2013.01) |
| H01G 11/32 | (2013.01) |
| H01G 11/26 | (2013.01) |
| H01G 11/56 | (2013.01) |
| H01L 29/51 | (2006.01) |
| C08G 73/02 | (2006.01) |

(52) U.S. Cl.
CPC .............. *H01G 9/028* (2013.01); *H01G 9/042* (2013.01); *H01G 9/048* (2013.01); *H01G 9/15* (2013.01); *H01G 11/26* (2013.01); *H01G 11/32* (2013.01); *H01G 11/56* (2013.01); *H01G 11/86* (2013.01); *H01L 21/28194* (2013.01); *H01L 29/518* (2013.01)

(58) Field of Classification Search
USPC ...................................................... 29/25.03
See application file for complete search history.

(56) References Cited

U.S. PATENT DOCUMENTS

| | | | | |
|---|---|---|---|---|
| 6,064,561 | A * | 5/2000 | Harada | .................. H01G 9/155 29/25.03 |
| 2004/0265692 | A1* | 12/2004 | Long | .................. H01M 4/0466 429/223 |
| 2009/0001009 | A1 | 1/2009 | Linder et al. | |
| 2012/0068327 | A1 | 3/2012 | Oganesian et al. | |
| 2014/0173889 | A1 | 6/2014 | Johnson et al. | |
| 2015/0170906 | A1 | 6/2015 | Redepenning et al. | |

FOREIGN PATENT DOCUMENTS

| | | |
|---|---|---|
| EP | 0437857 | 7/1991 |
| GB | 1329348 | 9/1973 |
| JP | H03203211 | 9/1991 |
| JP | 04125915 | 7/2008 |
| WO | 2014033277 | 3/2014 |

OTHER PUBLICATIONS

Kawai et al. (1991) "Preparation of Insulating Thin Film by Electrochemical Polymerization" Technology Reports of the Osaka University, (41)2053-2075:219-323.

Lacaze et al. (1980) "Electroforming and conduction in thin electrochemically prepared organic polytetrahydrofuran and polyacetonitrile films" Thin Solid Films, 66(2):159-170.

MacFarlane et al. (2001) "Low viscosity ionic liquids based on organic salts of the dicyanamide anion" Chem. Commun. 1430-1431.

Romann et al. (2015) "4-10 V capacitors with graphene-based electrodes and ionic liquid electrolyte" Journal of Power Sources, 280:606-611.

Wu et al. (2013) "Electrodeposition of germanium from the ionic liquid 1-butyl-1-methylpyrrolidinium dicyanamide" Phys. Chem. Chem. Phys. 15:4955-4964.

* cited by examiner

METHOD OF FORMING A DIELECTRIC THROUGH ELECTRODEPOSITION ON AN ELECTRODE FOR A CAPACITOR

The present invention relates to a method of forming a capacitor, a transistor or a dielectric layer on an electrode for the capacitor or transistor. In particular, it relates to a method in which an anionic electrolyte is electropolymerised to form said dielectric layer.

Double-layer capacitors include two uncoated electrodes and an electrolyte. As the electrodes are uncoated (i.e. they do not have a dielectric layer) only voltages up to 3 V (or 3.5 V in research articles) can be used.

Electrolytic capacitors include metal electrodes covered with a dielectric oxide layer (Ho et al. (2010) *IEEE Electrical. Insul. Mag.* 26, 20-25). However, these electrodes have a limited surface area (specific surface area up to ~10 $m^2$ $g^{-1}$). Furthermore, the energy density of aluminium electrolytic capacitors is up to 2 $J\ cm^{-3}$, but for voltages below 10 V, the energy density is very low, for example only 0.08 $J\ cm^{-3}$ at 6.3 V. This is due to the instability of aluminium (as well as tantalum) nanostructures.

Aluminium electrolytic capacitors tend to dry out, they do not tolerate welding temperatures, and cannot be prepared in surface-mount device forms. Tantalum is expensive, and therefore larger tantalum electrolytic capacitors are uncommon. Capacitors having a ceramic dielectric layer are usually non-polar devices, but ceramic capacitors have small capacitances.

There have been attempts to prepare dielectric layers onto capacitor electrodes by polymerizing neutral monomers in electrolyte solutions. Solid (dry) capacitors have been disclosed in various prior art documents, such as EP 0437857 A2 (Kinuta), JP 04125915 A (Soga), and Kawai, T. et. al, "Preparation of Insulating Thin Film by Electrochemical Polymerization", Technology Reports of the Osaka University; 1991; vol. 41; no. 2053-2075; pages 219-323. The problem with such capacitors is that they have a very low capacitance and the dielectric layer cannot be used in a wet electrochemical capacitor with porous carbon electrodes because of the lack of stability and self-healing effect in a conventional capacitor electrolyte solution. It is not obvious that low leakage current, necessary for the operation of a wet capacitor, could be achieved in an electrolyte, even if corresponding dry capacitor has been successfully tested. Furthermore, electrolyte mixture used for preparing the dielectric was not a suitable electrolyte for a capacitor, because of low ionic conductivity and lack of long-term stability.

Aluminium electrolytic capacitors have a self-healing property; technically if a hole forms in the $Al_2O_3$ dielectric layer, the underlying Al oxidizes to $Al_2O_3$, which restores the dielectric. However, if the electrode is carbon, it does not oxidize or change to a dielectric. The present invention relates to a different self-healing effect, in which an electropolymerisable anion closes any holes by electropolymerising to a dielectric material, driven by a higher electric field at the defective place of the charged electrode.

Up until now, only aluminum, tantalum, and niobium electrolytic capacitors are commercially produced. The energy density of low voltage electrolytic capacitors is however relatively low.

Other prior art not thought to be relevant includes EP 0106352 A1 (Kishida); U.S. Pat. No. 4,640,753 A1 (Banks); EP 0178816 A2 (Labes); and GB 1329348 A (Toyota).

The present invention seeks to provide improved capacitors, and methods of forming a dielectric layer on an anode of a capacitor.

In accordance with a first aspect of the invention, there is provided a method of forming a capacitor, including the steps of:
(a) providing a first electrode;
(b) providing a first electrolyte including an anionic compound, wherein said compound includes at least one cyano group or at least one nitrile group;
(c) electropolymerising said anionic compound in order to form a dielectric layer on at least part of the first electrode;
(d) forming a capacitor including the electrode of step (c), a second electrode and a second electrolyte, which is the same or different to the first electrolyte and may for example be an ionic liquid or a salt solution in an organic solvent.

In accordance with a second aspect of the invention, there is provided a method of forming a transistor, including the steps of:
(a) providing a first electrode;
(b) providing a first electrolyte including an anionic compound, wherein said compound includes at least one cyano group or at least one nitrile group;
(c) electropolymerising said anionic compound in order to form a dielectric layer on at least part of the first electrode;
(d) forming a transistor including the electrode of step (c).

In accordance with a third aspect of the invention, there is provided method of forming a dielectric layer on an electrode, including the steps of:
(a) providing a first electrode;
(b) providing a first electrolyte including an anionic compound, wherein said compound includes at least one cyano group or at least one nitrile group;
(c) electropolymerising said anionic compound in order to form a dielectric layer on at least part of the first electrode.

In a further aspect of the invention, there is provided a method of forming a dielectric layer on an electrode for use in a capacitor, including electropolymerising an ion from an electrolyte. The ion may be an anion having the formula $X(CN)_a(Y)_b$ wherein X is N, B, C, O, Al, Si, Ta, or Nb; wherein a is an integer from 1 to 6; wherein Y is an optional functional group; and wherein, when Y is present, b is an integer being 1 or 2. Thus the invention may encompass an electrode including a dielectric layer, wherein the electrode is carbon or an electrode including a dielectric layer, wherein the electrode is aluminium, tantalum, titanium, hafnium or niobium.

The dielectric layer formed by these processes allows the use of cell voltages greater than 3.5 V. By contrast, commercial double layer capacitors allow the use of cell voltages only up to 3 V with 3.5 V having been achieved only in research papers. The dielectric layer formed by electropolymerising the anions from the electrolyte solution thus can form onto a variety of conductive surfaces. This makes it possible to use carbon electrodes, upon which a protective layer in conventional electrolytic capacitor electrolytes cannot be formed.

The anionic compound preferably has the formula $[X(CN)_a(Y)_b]^-$ wherein X is N, B, C, O, S, Se, P, Al, Si, Ta, Nb, $C_5$ (cyclopentadienide), $C_4N$ (pyrrolide), $C_3N_2$ (imidazolide), $C_3N_2O$ (2-oxo-imidazolide), $C_3N_3O$ (6-oxo-s-triazinide), $C_2N_3$ (1,2,3-triazolide), $C_s$ (p-quinomethanide), $C_2N_2P$ (1,3-diaza-2-phospholate), $C_2N_2SO$ (1,3-diaza-2-sulfinylate); wherein a is an integer from 1 to 6; wherein Y is an optional functional group; and wherein, when Y is present, b is an integer being 1 or 2.

When Y is present, it preferably has the formula: $(R_1)_m$ $(R_2)_n R_3$, wherein $R_1$ is O, S, Se, $SO_2$, $OSO_2$, CO, OCO, COO, $N(CF_3)$, N(CN), or OC(=O)O; wherein $R_2$ is $CH_2$, $CF_2$, CHF, CH(CN), CF(CN), C(=O)N(CN), C(=O)N($CH_3$), C(=O)N($CF_3$), $CH_2CH$=CH, or $CF_2CF$=CF; wherein $R_3$ is H, F, $CH_3$, $CF_3$, $CFH_2$, $CF_2H$, CN, CH=$CH_2$, CF=$CF_2$, CF=CHF, C≡CF, C≡CH, =C(CN)$_2$, =C(CN)F, CH(CN)$_2$, CF(CN)$_2$, $CF_2$CN, C(CN)$_3$, C(CN)$_2 CF_3$, N(CN)$_2$, HC=N—CN, FC=N—CN, HC=C(CN)$_2$, FC=C(CN)$_2$, C(CN)=N—CN, C≡C—CN, C(CN)=C(CN)$_2$, phenyl, dicyanophenyl, trifluorodicyanophenyl fluorophenyl, difluorophenyl, trifluorophenyl, tetrafluorophenyl, or pentafluorophenyl; wherein m is an integer being equal or larger than 0; and wherein n is an integer being equal or larger than 0.

In a particularly preferred embodiment, the anionic compound is $N(CN)_2^-$, $B(CN)_4^-$, $C(CN)_3^-$, $B(CN)_3(OCH_3)^-$, $OCN^-$, $Al(CN)_4^-$, pentacyanocyclopentadienide, tetracyanopyrrolide, 4,5-dicyano-2-(trifluoromethyl)imidazolide, 2,4-dicyano-6-oxo-s-triazinide, 7,7',8,8'-tetracyano-p-quinomethanide, 4,5-dicyano-1,2,3-triazolide, 2,2,2-trifluoromethylsulfonyl-N-cyanoamide, or a pentacyanopropenide anion.

These anions can form a dielectric layer with relatively low leakage currents—no other method is capable of doing this. It is not obvious that an anion can be polymerised to a more compact layer than a neutral monomer. Only small anions can penetrate into a dielectric layer on a positively charged electrode by Coulombic forces and seal any hole by electropolymerising to a polymer. Only some anions have a specific polymerization mechanism, enabling them to form a compact dielectric layer on an electrode surface. Nitrile-based anions polymerize to dielectric films, which may have larger dielectric constant than organic polymers. Accordingly, the resulting capacitors demonstrate high energy densities.

The very high energy densities obtained by the present applicant for a 5 V capacitor are caused by a combination of dielectric strength of an electropolymerised layer and electrochemical stability of the anion in ionic liquid.

The first electrode may be formed from carbon, aluminium, tantalum, niobium, hafnium or titanium. The preferred electrode material is carbon, for example a mesoporous or macroporous thin film carbon electrode. In particular, the electrode may be in the form of one or a few stable atomically thin graphene sheets. The surface area can be more than 2600 $m^2 g^{-1}$. Graphene is chemically very stable, but atomically thin metal sheets are not.

The surface area of the capacitor can be an order of magnitude higher, and thus the capacitance is noticeably higher. Therefore, there is a considerable advantage in using carbon electrodes and more than 10 times higher energy densities can be reached, compared to conventional aluminium and tantalum electrolytic capacitors within the 4-10 V range.

A surprising outcome is that single-layer graphene can be coated with a dielectric layer, while the sheet conductivity of graphene increases. This is in contrast to most dielectric deposition methods, which create defects in the graphene sheet and lower the conductivity to the level that the sheet cannot be used as an electrode material.

A further surprising outcome is that that an ionic liquid can be used as an electrolyte, supplying a high voltage to the cathode and passivating anode at the same time. Alternatively it may be a salt solution in an organic solvent.

In a further aspect of the invention, there is provided an electronic device including a capacitor, a transistor or an electrode produced by means of a method as defined above.

It is believed that a number of dielectric compounds produced by the method as defined above are new compounds not previously isolated. Accordingly, polytetracyanoborate, polycyani, or polytricyanomethanide as claimed per se in the present application.

Polydicyanamide is not claimed as novel as it is believed that this has been mentioned in passing as a by-product in one paper (M. Wu, N. R. Brooks, S. Schaltin, K. Binnemans, J. Fransaer, Phys. Chem. Chem. Phys. 15 (2013) 4955-4964) in which it was noted that an insulating compound forms during electrodeposition of germanium from dicyanamide ionic liquid. The compound was not however analyzed or named, and nor was it proposed that the compound could be used in capacitors.

Embodiments of the present invention are described below, by way of example only, with reference to the accompanying drawings, in which.

Figure 1:
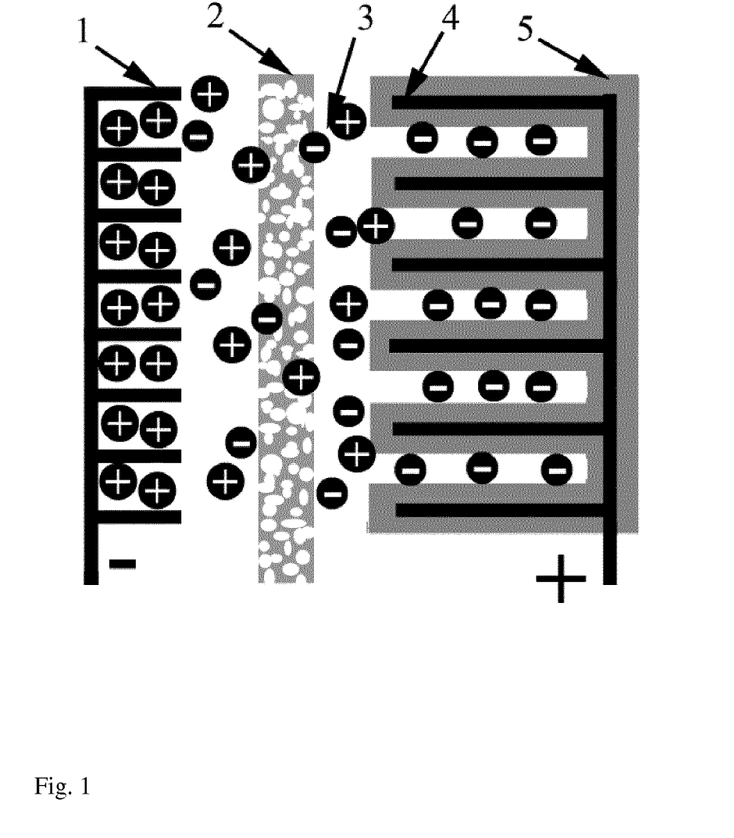
FIG. 1 is a schematic drawing of an embodiment of a capacitor.

FIG. 1 illustrates an embodiment of a capacitor or more specifically an electrochemical capacitor. The capacitor includes a negatively charged electrode 1 (the cathode) and a positively charged electrode 4 (the anode). One or both electrodes are preferably carbon. In other embodiments they may be aluminium, tantalum, titanium, hafnium or niobium. An insulating dielectric polymer layer 5 is provided on the anode. An electrolyte 3 provides ionic conductivity, and in preferred embodiments, is also a source of electropolymerisable anions for formation of the dielectric layer 5 as described in more detail below. In this embodiment, a membrane 2 is provided between the cathode 1 and the anode 4. However, the membrane 2 is optional, because due to the dielectric layer 5 at the anode 4 the capacitor can function without it. In some embodiments, aluminium current collectors (not shown in FIG. 1) may be provided, but these are not vital for the functioning of the device.

As indicated above, the electrolyte 3 provides electropolymerisable anions. These form the dielectric layer 5 when they are polymerised at highly positive voltages. The anion includes at least one cyano (nitrile) ligand. Preferably, the electropolymerisable anion is dicyanamide. By way of Example 1, dicyanamide ($N(CN)_2^-$) polymerises to a dielectric polymer polydicyanamide, which withstands high electric fields and is a suitable material to be used in capacitors. In an embodiment, the dielectric layer may be from 12 to 35 nm thick for electrodes passivated from 3.4 to 9.5 V. The thickness of the dielectric layer increases in proportion with the passivating potential.

In some embodiments, some of the cyano groups can be replaced by other functional groups in order to improve the dielectric properties of the polymer layer formed. Examples of suitable functional groups include $OCH_3$, $CHFCFH_2$ or $CF_2CF=CF_2$. For example, functional groups can increase the dielectric constant of the dielectric layer formed ($CHFCFH_2$) or can participate in the dielectric layer formation/polymerization process (for example, $CF_2CF=CF_2$), making the layer more stable. Other functional groups (for example, $OCH_3$) can lower the viscosity and melting point of ionic liquid used. Some optional groups contain nitrile or cyanide groups, therefore, just represent a more complicated structure of the anion, which cannot be represented by the general formula only.

The electrolyte 3 can be an alkali metal-based salt or a tetraalkylammonium cation based salt, for example. This may be dissolved in an organic solvent, such as gamma-butyrolactone (GBL), acetonitrile, alkylcarbonate, etc. The electrolyte 3 could also be an ionic liquid (preferably room temperature ionic liquid). An ionic liquid electrolyte cannot dry out like conventional electrolytes including organic solvents. Furthermore, it will not explode upon heating as there are no oxidisers in the system. The electrolyte therefore preferably provides a safe system.

The liquid electrolyte includes a cation that is stable at sufficiently negative potential. The cation may be, for example, tetraalkylammonium, N-alkylalkylpyridinium, N,N-dialkylpyrrolidinium, dialkylimidazolium, tetraalkylphosphazene, etc. In a particular example, 1-butyl-1-methylpyrrolidinium dicyanamide (BMPDCA) may be used as the electrolyte and source of electropolymerisable anion. This electrolyte is liquid at −55° C. and can be directly used in industrial applications, which is quite uncommon for most ionic liquids.

The ionic liquid could be mixed with non-aqueous solvents, salts, or polymers, which will provide the electrolyte with desired physical properties, such as low viscosity, high ionic conductivity or gel-like structure.

Ionic liquid electrolytes tolerate high temperatures from 250 to 500° C., and electropolymerised polydicyanamide dielectrics tolerate temperatures higher than 300° C., thus can withstand soldering temperatures. The capacitors can be manufactured in true SMD package types. The developed capacitor can be used in the same way as tantalum and aluminium electrolytic capacitors, for example in the line filtering application.

Passivation of the anode 4 is accomplished by applying an electrode potential (E) more positive than 1.6 V (vs. AglAgCl in ionic liquid), or by using potential cycling between 0 V and a potential more positive than 1.6 V. For example, passivation can be carried out using constant current (from 0.1 to 500 $mA\,cm^{-1}$) or constant potential scan rate (from 0.001 to 1 $Vs^{-1}$) up to a passivating potential, followed by holding the electrode at the passivating potential. In an example, passivation may start at 2.5 V in order to avoid filling the pores with low chain length polydicyanamide oligomers. In some embodiments, a two second pulse at 2.5 V may be provided to the electrode at the beginning of the passivating procedure.

Passivation may be carried out at different temperatures, preferably between about 20° C. and 125° C. A higher passivation temperature results in better stability at higher temperatures, but a lower capacitance. Applied potential and the time to passivate the anode 4 depends on the specific nature of the anion and on the temperature applied. For example, it can take 24 hours to passivate a porous carbon electrode with polydicyanamide at 23° C., whereas at 85° C. it may take only 6 to 12 hours.

The electrochemical passivation procedure could, in some embodiments, be carried out with a separate counter electrode, which is removed before the final assembling of the capacitor.

To remove volatile and gaseous products formed at the cathode 1 and anode 4 during the initial anode passivation process, the passivation procedure could be carried out under reduced pressure conditions. In some embodiments, the passivation procedure may involve after-treatment processes, such as heating or chemical oxidation or reduction reactions. After-treatment of the electropolymerised layer may include heating in air, hydrogen, inert gas or vacuum conditions up to 500° C. (preferably between 125 and 400° C.).

This present method results in a dielectric layer 5 that can be deposited on many surfaces. It is therefore of practical value to use a large surface area carbon anode 4. Therefore, the anode 4 is preferably a thin film carbon electrode, for example large surface area graphene, reduced graphene oxide, carbon nanotubes, amorphous carbon, carbon fabric, carbon aerogel, high temperature carbonized organic polymer, etc. The surface area may be more than 2600 $m^2\,g^{-1}$, for example. The carbon material should be mesoporous or macroporous to provide space for the formed dielectric layer 5. By way of example, a pore size of 25 to 75 nm may be suitable to allow formation of a dielectric layer 12 to 35 nm thick. Suitable pore size (distance between individual graphene sheets or carbon nanotubes) may be between 5 nm and 1 mm (preferably between 12 nm and 250 nm). All carbon particles should be rigidly connected to the carbon skeleton to prevent electrical isolation of separated particles during the dielectric synthesis process. In an embodiment, graphene oxide solution in water or ethanol can be used as a "conductive glue" to connect separate carbon structures. Graphene oxide becomes electrically conductive after chemical or thermal reduction. If the structure uses defect-free graphene sheets, it should have good electrical conductivity. However, if the graphene sheets have defects (for example thermally reduced graphene oxide (RGO)) or an amorphous carbon electrode with low electrical conductivity is used, an additional 0.5 to 20 μm thick (for example, 1 μm thick) aluminium layer can be added to the anode 4, for example by magnetron sputtering, to function as a current collector. The sputtered aluminium side of the electrode can be welded onto aluminium foil or other known capacitor contact (terminal) materials. In other embodiments, the anode 4 may be a metal such as porous Al, Ta, Ti, or Nb folium or sintered material.

The cathode 1 is preferably a large surface area carbon electrode, such as graphene, reduced graphene oxide, carbon nanotube, carbon fabric, coconut carbon, carbide derived carbon, etc. It is preferred that the carbon is mainly mesoporous, to provide a low time constant for the capacitor system. The cathode 1 can be a pseudocapacitive cathode, consisting of $TiO_2$, $MnO_2$, $RuO_2$ or other similar compounds, known to those skilled in the art. The cathode 1 should be thinner than anode 4 and the thickness of the electrodes should be precisely controlled to get the maximum cell voltage possible. The anode is preferably 10 to 200μ thick, and the cathode is preferably 0.01 to 10μ thick. The skilled person can calculate suitable thickness for the cathode using the capacitance (per volume) values for both electrodes to obtain equal charges on both electrodes.

As indicated above, an optional membrane 2 may be placed between the anode 4 and the cathode 1. The membrane is preferably a very thin porous non-conducting layer, which also tolerates elevated temperatures. It may be prepared by directly depositing the membrane 2 onto one of the electrodes 1,4. For example, sub-micrometre thick organic (fluorinated carbons etc.) or inorganic (alumina or other dielectric oxides) membranes can be prepared by electro-spinning, magnetron sputtering or other vacuum or gas phase evaporation techniques.

Conventionally, membranes in supercapacitors function to stop movement of loose particles, which might create a short-circuit. However, where rigid electrodes 1,4 are used, the membrane can be thinner than usual resulting in a lower time constant and higher power density. If the electrodes are prepared with a space between the cathode and the anode, then the membrane can be omitted altogether. For example, carbon electrodes can be prepared by treating graphene oxide or polyimide films by a laser, wherein higher laser power can be used to burn away all material, thus creating a narrow space between anode and cathode. In such in-line capacitors, the anode and cathode are placed in the same plane without need for a membrane.

The electrodes 1,4 can be packed into the capacitor's case before or after the anode passivation step. The packing type can be a rolled or sandwich-type cell, and the electrodes 1,4 may be separated by a thin membrane 2 as depicted in FIG. 1. Finally, the capacitor is sealed into a moisture-proof case. It is recommended to use well-dried compounds and to assemble the capacitors in an inert gas atmosphere.

The above-described embodiment involves electropolymerising anions in the electrolyte 3 to form the dielectric layer 5 in its entirety. However, in a modification the passivation process is used for closing some leaking spots within a dielectric layer 5 on the anode 4 during the electrode working at positive voltages—i.e. self-healing. In such cases, the anode 4 may previously have been covered with a thin film having high dielectric constant, for example a dielectric oxide layer as found in conventional electrolytic capacitors. Examples of suitable dielectric oxide layers include $Al_2O_3$, $BaTiO_3$, $SrTiO_3$, $CaCu_3Ti_4O_{12}$, $HfO_2$, $TiO_2$, $Ta_2O_5$, $Nb_2O_5$, etc.

In the preferred embodiment, as described above, the electrolyte 3 provides ionic conductivity within the capacitor as well as being the source of the electropolymerisable anions for formation of the dielectric layer 5. In some embodiments, it may be preferable that the electrolyte 3 used for passivation is different to the actual electrolyte in the assembled capacitor. It could have the same composition, but the electrolyte 3 used for passivation could be replaced in the assembled capacitor by pure substance to reduce or eliminate by-products that have evolved at the anode or cathode. Such by-products may get deposited or may increase the viscosity of the ionic liquid. For example, 1 M tetraalkylammonium dicyanamide solution in propylene carbonate is cheaper and easier to remove than neat BMPDCA. In some embodiments, the final electrolyte could be also an electropolymerizable ionic liquid doped solid electrolyte, such as polypyrrole, poly(3,4-ethyldioxythiophene), or other electrically conductive polymer.

The above-described electropolymerisation procedure may be used to create a dielectric layer on carbon surfaces that are used not only in wet capacitors, but also in dry capacitors, capacitor-like systems, or just as a dielectric coating. Dielectric coating of carbon resistors, carbon nanotube wires, graphene transitors (gate dielectric material) can be used in a variety of conducting, semiconducting, or resistive devices. The main component of the field effect transistor is the capacitor formed by the dielectric material between the gate electrode and the depletion region that forms in the substrate under the gate. Porous carbon electrodes, coated with electropolymerised dielectric layer, can be used as sensors in gas or liquid media, for detecting gases, ions or neutral compounds.

The applicant has shown that a dielectric layer can be electropolymerised onto graphene without destroying its good conductivity; and moreover increasing the conductivity.

Furthermore, the dielectric layer sticks to the carbon surface without soaking and coming off in ionic liquid electrolyte; a porous graphene-based electrode material with a continuous carbon skeleton can be completely passivated; a compact dielectric layer and low leakage current densities can be achieved at voltages higher than 3.5 V when the passivating procedure is carried out using proper steps. Furthermore, some active metals (such as Al, Ti, or Ta), can be also passivated without being dissolved in the ionic liquid used.

In summary, the present application relates to a capacitor having carbon or metal electrodes and an electrolyte which contains electropolymerisable anions. Applying a sufficiently positive voltage, a thin dielectric layer forms at the positive electrode, enabling the use of cell voltages higher than 3.5 V. The construction and characteristics of capacitors with 5, 6.3, and 10 V of cell voltages, having reduced graphene oxide electrodes and an ionic liquid electrolyte, are disclosed.

EXAMPLE 1

1-Butyl-1-methylpyrrolidinium dicyanamide (BMPDCA) ionic liquid was used as an electrolyte and the source of the electropolymerisable anion. Electrochemical polymerisation and the following measurements were conducted in a three electrode cell with AgIAgCl wire in BMPDCA as a reference electrode. The polymerisation reaction starts at 1.6 V, but for the sake of stability the polymer layer was synthesised by holding the electrode 24 hours at potentials exceeding 2.5 V. The formed new water and acetone insoluble transparent non-conducting polymer polydicyanamide (PDCA) was characterised by infrared spectroscopy; there was a peak at 2172 $cm^{-1}$ and a very wide peak at around 1558 $cm^{-1}$, indicating the existence of single, double and triple N—C bonds in the polymer. According to spectroscopic analysis and quantum chemical calculations, the polymer has a linear $(C=N-CN)_n$ structure.

The large surface area carbon electrode used in this sample capacitor was made from reduced graphene oxide (RGO). RGO electrodes were produced by thermal reduction of graphene oxide (GO) upon quickly heating to 500° C. Dispersion of GO (2.5 mg $mL^{-1}$), multi-wall carbon nanotubes (MWCNT) (0.8 mg $mL^{-1}$), and RGO (5 mg $mL^{-1}$) was prepared by first applying ultrasound bath for 30 minutes for GO and MWCNT solutions in ethanol and then mixing with RGO. The 50 μm thick electrode material was prepared by repeating steps of spray-pyrolysing the solution onto a flat support at 225° C. and roll-pressing the material. Later, the electrode material was heated in vacuum up to 600° C. and (after cooling down) coated with 1 μm thick aluminium layer by magnetron sputtering for good electrical contact.

Figure 2:
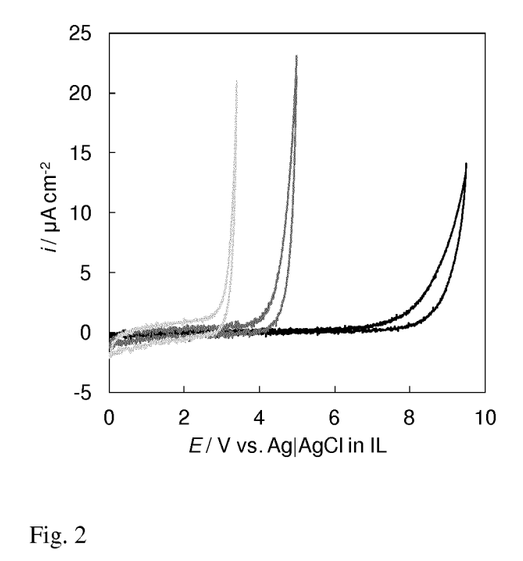
FIG. 2 shows low scan rate cyclic voltammograms at potential scan rate of 10 mV $s^{-1}$ for the reduced graphene oxide (RGO) electrode in 1-butyl-1-methylpyrrolidinium dicyanamide (BMPDCA) measured 24 hours after passivation steps at 3.4 V, 5 V, and 9.5 V vs. Ag|AgCl in BMPDCA.
Figure 3:
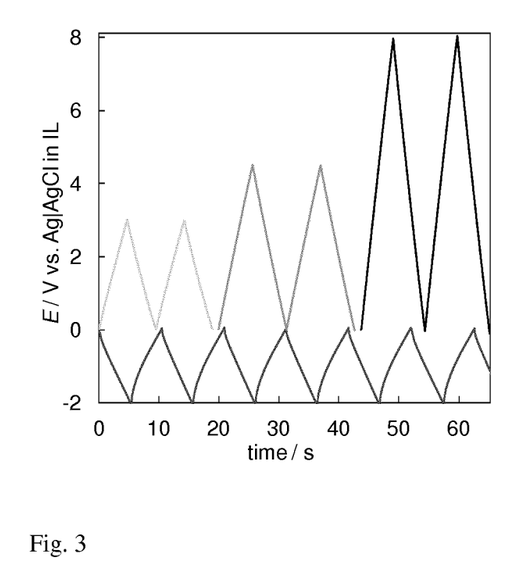
FIG. 3 shows constant current charge-discharge curves for the positive and negative electrodes from 0 V to 3 V (at current density of 159 $\mu cm^{-2}$), 4.5 V (80 $\mu A\ cm^{-2}$), 8 V (44 $\mu cm^{-2}$), and −2 V (40 mA $cm^{-2}$). The 0 to −2 V charge-discharge curve corresponds to an unmodified RGO electrode.

The negative potential limit for the RGO electrode was −2 V. The positive electrode was passivated using linear potential sweep voltammetry at a scan rate of 10 $mVs^{-1}$, starting at 2.5 V then the electrode was held under the passivating potential at room temperature for 24 hours to obtain low leakage currents (see FIG. 2). The capacitance of the RGO single electrode at 3 V (passivated at 3.4 V) was 60 mF cm$^{-3}$ or 161 mF g$^{-1}$. By combining −2 V RGO negative and +3 V RGO positive electrode (FIG. 3), a 5 V capacitor with energy density of 0.43 J cm$^{-3}$ can be constructed. It has a much better energy density than a 4 V tantalum electrolytic capacitor (see Table 1 below).

TABLE 1

Cell voltage, capacitance (C) and energy density (w) of PDCA and some commercial capacitors.

| Capacitor | E/V | C/mF cm$^{-3}$ | w/J cm$^{-3}$ |
|---|---|---|---|
| Tantalum solid 1 mF | 4 | 8.9 | 0.07 |
| Aluminium electrolytic 3.3 mF | 6.3 | 2.1 | 0.08 |
| RGO/PDCA* | 5 | 34 | 0.42 |
| RGO/PDCA* | 6.3 | 16.8 | 0.31 |
| RGO/PDCA* | 10 | 5.4 | 0.27 |

*per volume of the positive and negative electrode

Figure 4:
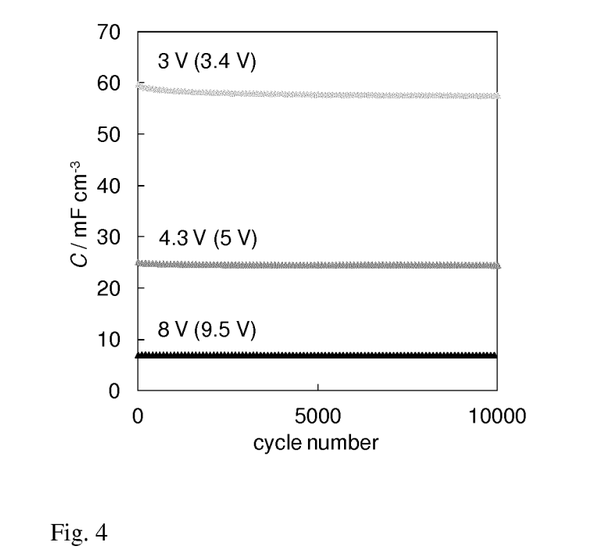
FIG. 4 shows dependence of capacitance for the positively charged electrode on cycle number at different voltages vs. Ag|AgCl in BMPDCA (the voltage in brackets is the passivating voltage used in Example 1)
Figure 5:
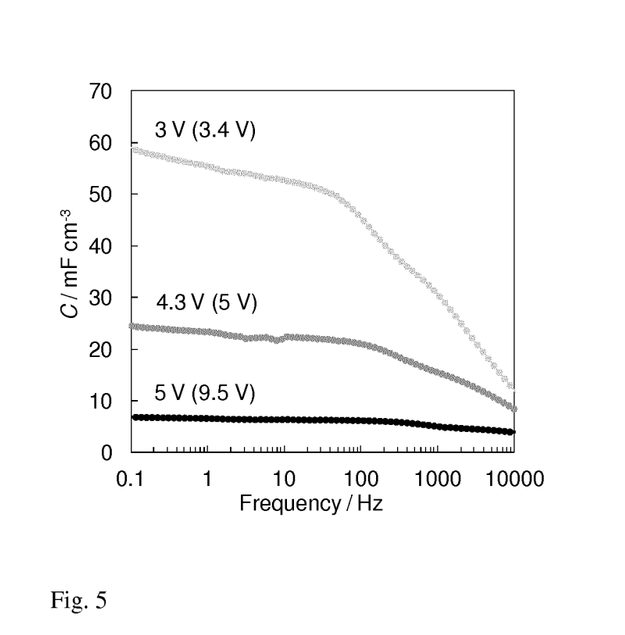
FIG. 5 shows capacitance for the positively charged electrode vs. frequency plots at different voltages vs. Ag|AgCl reference electrode in BMPDCA.

For the demonstration of the stability of PDCA capacitors, 10000 charge-discharge cycles are shown in FIG. 4 with coulombic efficiency over 99.8%. A slight decrease in capacitance takes place during the first 2000 cycles, but very stable behaviour can be seen during the last 5000 cycles of the testing period, where the capacitance change is less than 0.2%. The capacitance dependence on frequency in FIG. 5 shows that the capacitor can be used at 120 Hz, but higher frequencies should be accessible when the electrodes are moved closer (to less than 3 mm in this three electrode cell). The pore size of carbon particles for specific voltages should be optimized as, according to theoretical calculations, 7-fold improvement in energy density is realistic.

The improved temperature range for BMPDCA of from −55 to 175° C., compared with −55 to 105° C. for conventional electrolyte used in aluminium electrolytic capacitors is another important advantage.

EXAMPLE 2

Flat electrodes were passivated with cyclic voltammograms between 0 and 10 V, followed by holding the electrode at 10 V for 24 hours. Examples of the dielectric polymers obtained are provided in Table 2 below.

TABLE 2

New dielectric polymers prepared by electropolymerisation at 23° C. and at +10 V vs. Ag|AgCl in IL.

| Source anion (Electrolyte) Electrode | Onset polymerization potential | Infrared absorption bands/cm$^{-1}$ | Physical properties | Product name |
|---|---|---|---|---|
| Tetracyanoborate B(CN)$_4^-$ (EMImTCB) aC | 2.1 V | 2275 (w), 2233 (w, sharp), 979 (m), 946 (s) | Transparent film, insoluble in water and acetone | Polytetracyanoborate |
| Cyanate OCN$^-$ (1M TBAOCN in PC) aC | 1.6 V | 2340 (m, sharp) 1800-1000 (s) | Transparent rough film, insoluble in water and acetone | Polycyani |
| Tricyanomethanide C(CN)$_3^-$ (BMPTCM) aC | 1.1 V | 2268 (s, sharp), 1500 (m), 1062 (s), 865 (s) | Brown sticky layer, soluble in acetone; thin transparent layer, insoluble in water and acetone | Polytricyanomethanide and hexacyanoethane |
| Dicyanamide N(CN)$_2^-$ (BMPDCA) aC | 1.6 V | 2172 (s, sharp), 1750-1050 (s) | Transparent film, insoluble in water and acetone | Polydicyanamide |
| Dicyanamide (1M BMPDCA in PC) aC | 1.6 V | 2172 (s, sharp), 1750-1050 (s) | Transparent film, insoluble in water and acetone | Polydicyanamide |
| Dicyanamide (50% BMPDCA in BMPTFSI) aC | 1.6 V | 2172 (s, sharp), 1750-1050 (s) | Transparent film, insoluble in water and acetone | Polydicyanamide |
| Dicyanamide (BMPDCA) Graphene | 1.7 V | 2172 (s, sharp), 1750-1050 (s) | Transparent film, insoluble in water and acetone | Polydicyanamide |
| Dicyanamide (BMPDCA) Al | 2 V | 2172 (s, sharp), 1750-1050 (s) | Transparent film, insoluble in water and acetone | Mixed Al$_2$O$_3$, AlN and polydicyanamide |
| Dicyanamide (BMPDCA) Ta | 2.1 V | 2172 (s, sharp), 1750-1050 (s) | Transparent film, insoluble in water and acetone | Polydicyanamide |
| Dicyanamide (BMPDCA) Ti | 1.8 V | 2172 (s, sharp), 1750-1050 (s) | Transparent film, insoluble in water and acetone | Polydicyanamide |

*aC - flat amorphous carbon electrode prepared by magnetron sputtering, EMImTCB - 1-ethyl-3-methylimidazolium tetracyanoborate, PC - propylene carbonate, BMPTFSI - 1-butyl-1-methylpyrrolidinium bis(trifluoromethylsulfonyl)imide, TBAOCN - tetrabutylammonium cyanate The data in Table 2 indicate that
a) A family of similar anions, like $N(CN)_2^-$, $B(CN)_4^-$, $C(CN)_3^-$, and $OCN^-$ exist and form different dielectric polymers by electropolymerisation. All polymers formed contain carbon and nitrogen, and may additionally contain oxygen (polycyanani), boron (polytetracyanoborate), or some other elements.
b) Polymerisation occurs regardless of the cation or solvent composition of the electrolyte used in the capacitor—polydicyanamide film was obtained in 1 M BMPDCA solution in PC, 1:1 mixture of BMPDCA and BMPTFSI ionic liquids, or in neat BMPDCA liquid.
c) Some metals, like Al, Ta, and Ti can be passivated (coated with a dielectric layer), while some metals, like Ag or Cu, dissolve in the electrolyte without being passivated.
d) Experiments with flat graphene electrodes indicate that during passivation of the electrode at 10 V in BMPDCA electrolyte, the resistance of the graphene sheet decreased from 458Ω (for the unmodifed graphene at zero charge potential) to 95Ω (i.e. the sheet conductivity of graphene increases 5 times). Thus the graphene sheets or carbon nanotube wires, coated with electropolymerised dielectric nanolayer, can be used in a variety of conducting and semiconducting devices.

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another.

The disclosures in UK patent application number 1417157.3, from which this application claims priority, and in the abstract accompanying this application are incorporated herein by reference.

The invention claimed is:

1. A method of forming a capacitor, including the steps of:
   (a) providing a first electrode;
   (b) providing a first electrolyte including an anionic compound, wherein said compound includes at least one cyano group or at least one nitrile group;
   (c) electropolymerising said anionic compound in order to form a dielectric layer on at least part of the first electrode;
   (d) forming a capacitor including the electrode of step (c), a second electrode and a second electrolyte, which is the same or different to the first electrolyte.

2. The method of claim 1, wherein the second electrolyte is an ionic liquid or a salt solution in an organic solvent.

3. An electronic device including a capacitor produced by means of a method as claimed in claim 1.

4. A method of forming a transistor, including the steps of:
   (a) providing a first electrode;
   (b) providing a first electrolyte including an anionic compound, wherein said compound includes at least one cyano group or at least one nitrile group;
   (c) electropolymerising said anionic compound in order to form a dielectric layer on at least part of the first electrode;
   (d) forming a transistor including the electrode of step (c).

5. An electronic device including a transistor produced by means of a method as claimed in claim 4.

6. A method of forming a dielectric layer on an electrode, including the steps of:
   (a) providing a first electrode;
   (b) providing a first electrolyte including an anionic compound, wherein said compound includes at least one cyano group or at least one nitrile group;
   (c) electropolymerising said anionic compound in order to form a dielectric layer on at least part of the first electrode.

7. The method of claim 6 wherein the anionic compound has the formula:

$$[X(CN)_a(Y)_b]^-$$

wherein X is N, B, C, O, S, Se, P, Al, Si, Ta, Nb, $C_5$ (cyclopentadienide), $C_4N$ (pyrrolide), $C_3N_2$ (imidazolide), $C_3N_2O$ (2-oxo-imidazolide), $C_3N_3O$ (6-oxo-s-triazinide), $C_2N_3$ (1,2,3-triazolide), $C_8$ (p-quinomethanide), $C_2N_2P$ (1,3-diaza-2-phospholate), $C_2N_2SO$ (1,3-diaza-2-sulfinylate); wherein a is an integer from 1 to 6; wherein Y is an optional functional group; and wherein, when Y is present, b is an integer being 1 or 2.

8. The method of claim 7, wherein when Y is present, Y has the formula:

$$(R_1)_m(R_2)_nR_3$$

wherein $R_1$ is O, S, Se, $SO_2$, $OSO_2$, CO, OCO, COO, $N(CF_3)$, $N(CN)$, or $OC(=O)O$; wherein $R_2$ is $CH_2$, $CF_2$, CHF, CH(CN), CF(CN), $C(=O)N(CN)$, $C(=O)N(CH_3)$, $C(=O)N(CF_3)$, $CH_2CH=CH$, or $CF_2CF=CF$; wherein $R_3$ is H, F, $CH_3$, $CF_3$, $CFH_2$, $CF_2H$, CN, $CH=CH_2$, $CF=CF_2$, $CF=CHF$, $C\equiv CF$, $C\equiv CH$, $=C(CN)_2$, $=C(CN)F$, $CH(CN)_2$, $CF(CN)_2$, $CF_2CN$, $C(CN)_3$, $C(CN)_2CF_3$, $N(CN)_2$, $HC=N-CN$, $FC=N-CN$, $HC=C(CN)_2$, $FC=C(CN)_2$, $C(CN)=N-CN$, $C\equiv C-CN$, $C(CN)=C(CN)_2$, phenyl, dicyanophenyl, trifluorodicyanophenyl fluorophenyl, difluorophenyl, trifluorophenyl, tetrafluorophenyl, or pentafluorophenyl; wherein m is an integer being equal or larger than 0; and wherein n is an integer being equal or larger than 0.

9. The method of claim 7, wherein X is N, B, C, O or Al.

10. The method of claim 7, wherein a is an integer from 1 to 4.

11. The method of claim 7, wherein the anionic compound is $N(CN)_2^-$, $B(CN)_4^-$, $C(CN)_3^-$, $B(CN)_3(OCH_3)^-$, $OCN^-$, $Al(CN)_4^-$, pentacyanocyclopentadienide, tetracyanopyrrolide, 4,5-dicyano-2-(trifluoromethyl)imidazolide, 2,4-dicyano-6-oxo-s-triazinide, 7,7',8,8'-tetracyano-p-quinomethanide, 4,5-dicyano-1,2,3-triazolide, 2,2,2-trifluoromethylsulfonyl-N-cyanoamide, or a pentacyanopropenide anion.

12. The method of claim 6, wherein the first electrode is formed from carbon, aluminium, tantalum, niobium, hafnium or titanium.

13. The method of claim 12, wherein the first electrode is a mesoporous or macroporous thin film carbon electrode.

14. The method of claim 12, wherein the first electrode is formed from graphene, doped graphene, reduced graphene oxide, carbon nanotubes, carbon fabric, carbon aerogel, or any thermally carbonized organic polymer.

15. The method of claim 6, wherein the first electrolyte provides ionic conductivity and is a source of electropolymerisable ions.

16. The method of claim 6, wherein the first electrolyte is an ionic liquid or a salt solution in an organic solvent.

17. An electronic device including an electrode produced by means of a method as claimed in claim 16.

18. A dielectric compound obtainable by means of a method as claimed in claim 6, which is polytetracyanoborate, polycyanani, or polytricyanomethanide.

* * * * *